United States Patent
Goh et al.

(10) Patent No.: US 8,439,292 B2
(45) Date of Patent: May 14, 2013

(54) AUTO-REEL CHANGER

(75) Inventors: Toh Hau Goh, Melaka (MY); Kam Kinn Lam, Melaka (MY); Wai Koon Chee, Selangor (MY)

(73) Assignee: Ismeca Semiconductor Holdings SA, La Chaux-de-Fonds (CH)

( * ) Notice: Subject to any disclaimer, the term of this patent is extended or adjusted under 35 U.S.C. 154(b) by 59 days.

(21) Appl. No.: 13/099,470

(22) Filed: May 3, 2011

(65) Prior Publication Data

US 2011/0220755 A1    Sep. 15, 2011

Related U.S. Application Data

(63) Continuation of application No. PCT/EP2009/058356, filed on Jul. 2, 2009.

(30) Foreign Application Priority Data

Nov. 17, 2008 (EP) .................................. 08169267
Dec. 22, 2008 (EP) .................................. 08172524

(51) Int. Cl.
*B65H 18/00* (2006.01)

(52) U.S. Cl.
USPC .................. 242/535; 242/532.6; 242/532.7

(58) Field of Classification Search ............... 242/532.6, 242/532.7, 534, 548, 332.8, 615.3, 332.7, 242/535
See application file for complete search history.

(56) References Cited

U.S. PATENT DOCUMENTS

| | | | | |
|---|---|---|---|---|
| 3,233,839 A | * | 2/1966 | Reinsch | 242/332.8 |
| 3,270,974 A | * | 9/1966 | Eagle | 242/332.8 |
| 4,010,912 A | * | 3/1977 | Dreher et al. | 242/532.6 |
| 4,604,154 A | * | 8/1986 | Fosnaught | 156/264 |
| 4,747,553 A | | 5/1988 | Ogawa | |
| 5,157,439 A | * | 10/1992 | Sakamoto et al. | 355/28 |
| 5,337,118 A | * | 8/1994 | Haller | 355/27 |
| 5,395,068 A | * | 3/1995 | Kostudis et al. | 242/348.1 |
| 5,632,454 A | * | 5/1997 | Murakami | 242/532.7 |
| 5,816,527 A | | 10/1998 | Nakae et al. | |
| 6,098,915 A | * | 8/2000 | Nakae et al. | 242/535 |
| 6,123,286 A | * | 9/2000 | Garcia et al. | 242/532.6 |

OTHER PUBLICATIONS

International Search Report for international application No. PCT/EP2009/058356 dated Oct. 21, 2009.

\* cited by examiner

*Primary Examiner* — William A Rivera
(74) *Attorney, Agent, or Firm* — Pearne & Gordon LLP

(57) ABSTRACT

A device for the automatic coiling and/or uncoiling on reels (28) of a flexible tape carrier of electronic components (60), the device comprising a coiling location (80) where a reel (28) can be connected to a rotation actuator, and retractable tape guides (35), consisting of articulated jaws (35) that can be closed together forming a channel to guide the flexible tape (60) and connect a free end of the flexible (60) tape (60) to a hub (29) of the reel (28), the device further having a stopper element (87) that engages with the slot in the reel hub, in order to stop the reel in a position in which the slot is aligned with the tape guide.

19 Claims, 9 Drawing Sheets

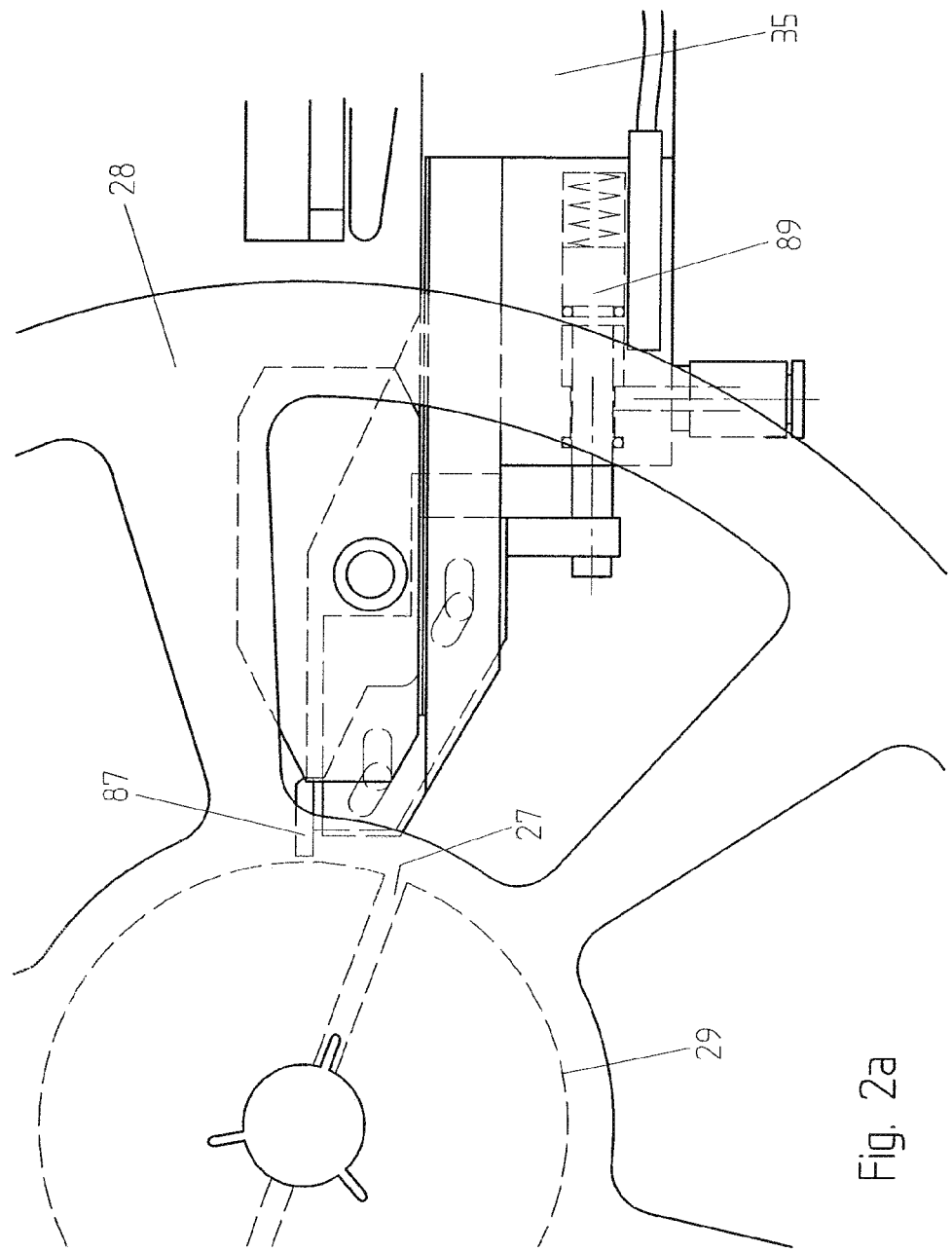

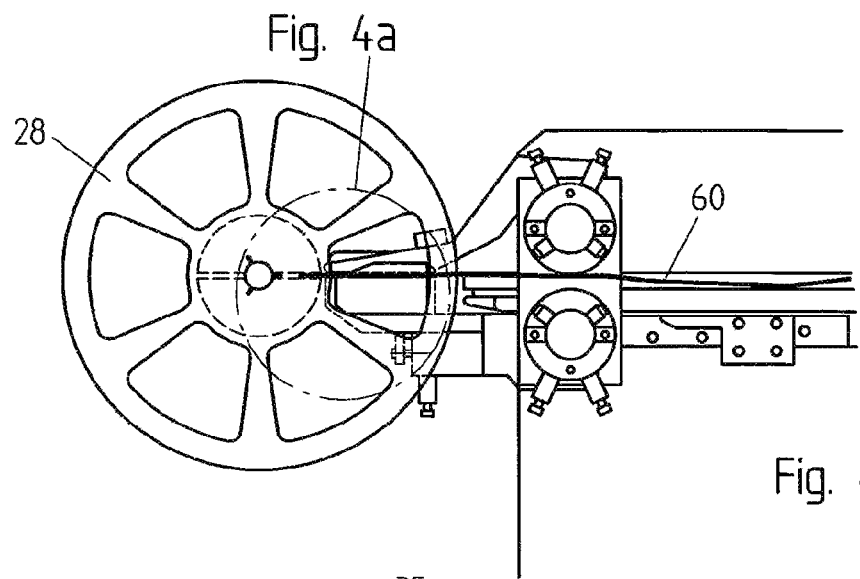
Fig. 4a
Fig. 4
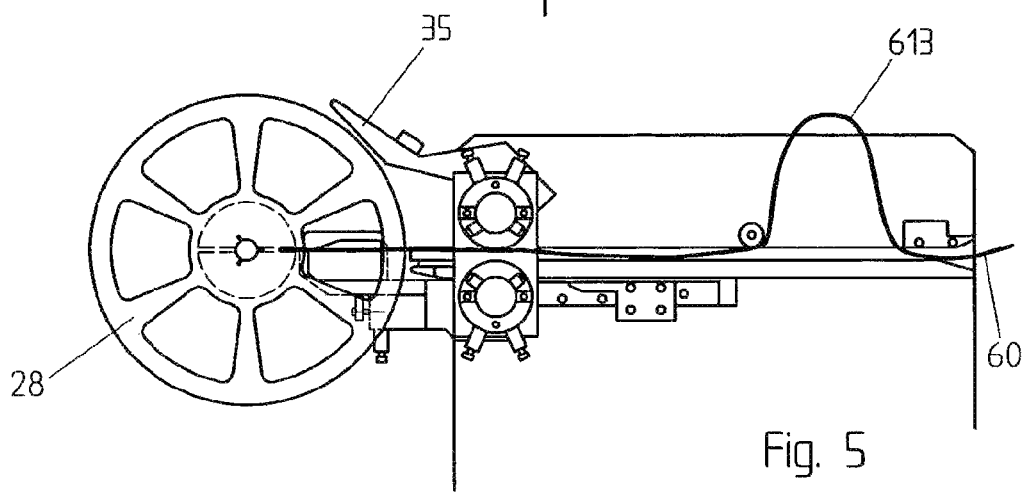
Fig. 5
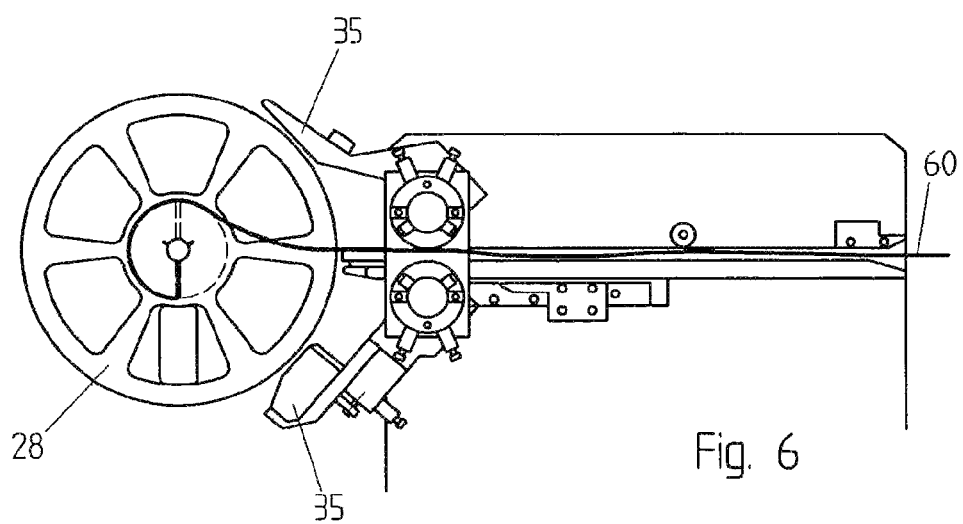
Fig. 6

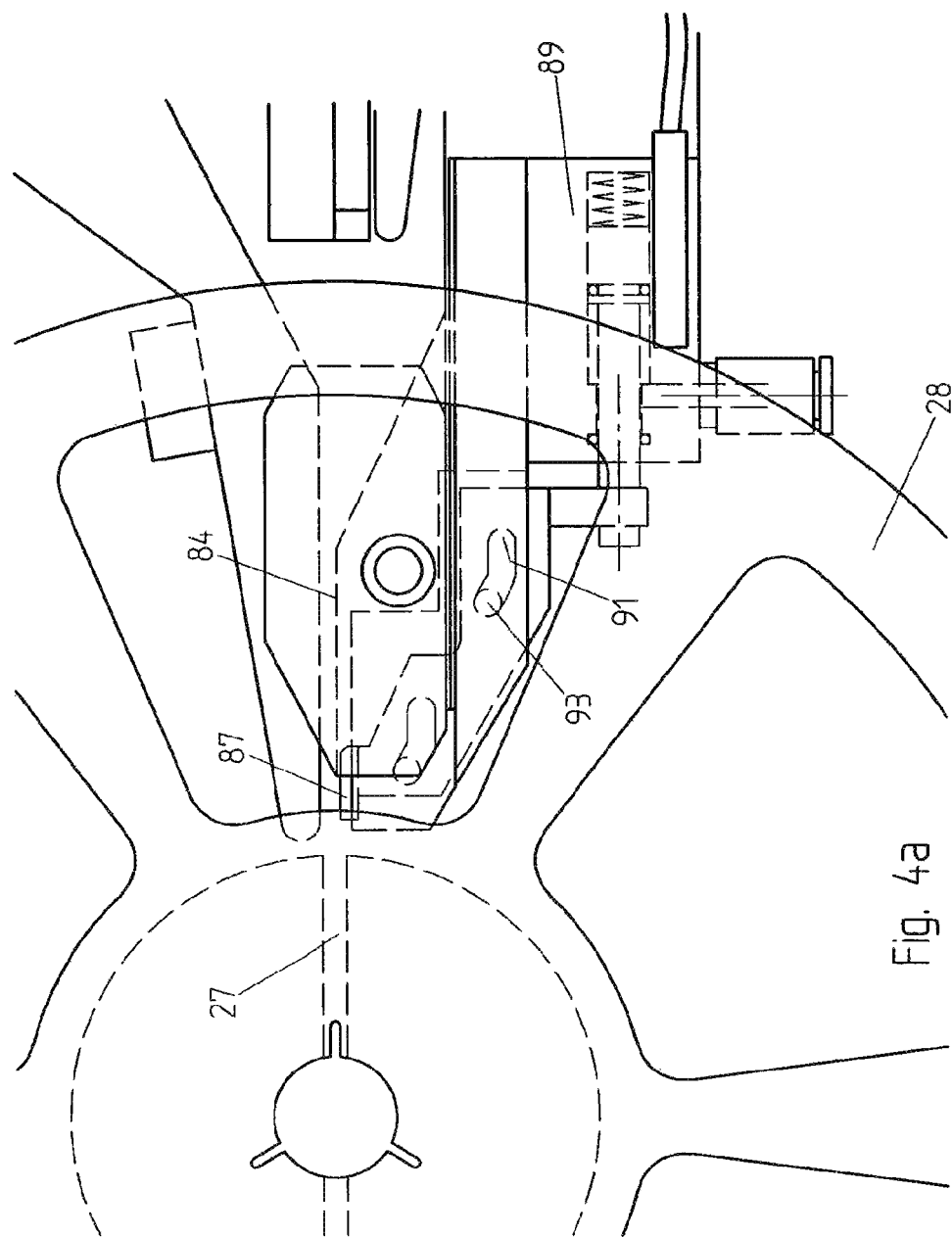

AUTO-REEL CHANGER

REFERENCE DATA

The present application is a continuation of PCT application No. PCT/EP2009/058356 (WO2010054865) filed Jul. 2, 2009 and claiming priority from European Patent Application EP08169267 filed on Nov. 17, 2008 and from European Patent Application EP08172524 filed on Dec. 22, 2008. The content of the PCT application is hereby incorporated.

FIELD OF THE INVENTION

The present invention relates to a device for loading and/or unloading reels with tape-form carriers. In particular, but not exclusively, the device of the invention is suitable for loading and/or unloading electronic components packaged in flexible tapes.

DESCRIPTION OF RELATED ART

Automation is a constant goal of many production industries and is of special importance in those manufacturing fields that involve the assembly of a plurality of components, like, for example, the production of electronic equipment. An important aspect of industrial automation is the transport and delivery of components to the different production units, or to workstations of a production line.

It is common in electronic testing and manufacturing, to package electronic components on a flexible tape support with longitudinally spaced pockets that correspond to the sizes and the shapes of the components. Packaging tapes can have indefinite length and may be conveniently coiled in reels for compact storage, protection, transport and interoperation with automatic machinery.

In this technical field the need frequently arises to coil tape carrier in reels having given characteristics for delivery or further processing.

Coiling and uncoiling operations are often done in a semi-automatic fashion, the reels receiving and delivering the tape carrier being driven in rotation by motors, while the empty and full reels are usually manually placed, and the tape leader is manually inserted in the empty reel. Manual operation being slow, costly, and error-prone, there is evidently a need for a device for loading and unloading reels of tape carriers at high speed and with a minimal manual intervention.

Flexible tapes are often used to carry relatively bulky and large electronic components. Especially when loaded, these tapes are heavy and do not offer high mechanical strength. High speed coiling is delicate in this case, because of the risk of tape failures. This imposes a limit to the speed of known coiling devices and methods, in particular during the delicate phase of insertion of the tape leader into the slot of the reel.

A first aim of the present invention is to provide a device, and the corresponding method, by which flexible tape carriers can be coiled in reels with less manual operations than in the devices and method that are known in the art.

A further aim of the present invention is to propose a device, and a corresponding method that are faster in coiling reels of tape carrier than the known devices and methods.

BRIEF SUMMARY OF THE INVENTION

According to the invention, these aims are achieved by means of the device that is the object of claim 1. More particularly, these aims are achieved by a device that has the features of the preamble of claim 1, characterized by a stopper element, drivable by an actuator in an engagement position in which the stopper elements engages with said reel, resulting in a stop of the rotation of the reel and leaving the reel in a predefined relationship with the tape guides and by a stop detector, providing a stop signal when the rotation of the reel is stopped by the stopper element.

Moreover, the aims of the present invention are achieved by a device for the automatic coiling and/or uncoiling of a flexible tape on reels comprising: a coiling location where a reel can be rotatably connected to the device; a tape insertion unit, operatively arranged to guide the flexible tape and connect a free end of the flexible tape to a 5 hub of the reel.

According to a variant, the aims of the invention are achieved by a device as stated above and further comprising: a first reel magazine for stocking reels to be processed and placed above the coiling location, a second reel magazine for stocking the reels that have been processed placed below the coiling location, the device being operatively arranged to move the reels to be processed from the first magazine towards the coiling location, coil the flexible tape in the reels, and to move the processed reels from the coiling location to the second magazine, the motion of the reels from said first magazine and/or to said second magazine being driven or assisted by gravity.

In a further variant, the aims of the invention are achieved by a device as above, so arranged that one or more sections of the flexible tape assume the shape of arcs, during a coiling operation.

Likewise, the above aims are attained by a method for coiling a flexible tape carrier on a reel, said tape comprising a leading end for engagement in the reel, the method comprising the steps of: feeding the flexible tape towards the reel; stopping or hindering the advance of said leading end with a first restriction means so as to produce a first slack arc portion in the flexible tape; detecting when the first slack arc portion has reached a determined height; stopping or hindering the advance of one intermediary portion of tape with a second restriction means while feeding the flexible tape further, so a to produce a second slack arc portion of tape; detecting engagement of said leading end into a hub of the reel or alignment of said leading end with a fixation feature of the hub of the reel; releasing the restriction means 161, 162.

Further optional features of the invention are the object of dependent claims.

BRIEF DESCRIPTION OF THE DRAWINGS

The invention will be better understood with the aid of the description of an embodiment given by way of example and illustrated by the figures, in which:

FIG. 2a illustrates a detail of the functioning of the stopper element before its engagement;

FIGS. 4 and 4a show the reel stopped with the slot aligned with the tape leader, and the stopper element in its rest position.

FIG. 5 illustrates the insertion of a free end of the flexible tape in the slot, and FIG. 6 shows the loading of the tape carrier in the reel.

DETAILED DESCRIPTION OF POSSIBLE EMBODIMENTS OF THE INVENTION

Figure 1:
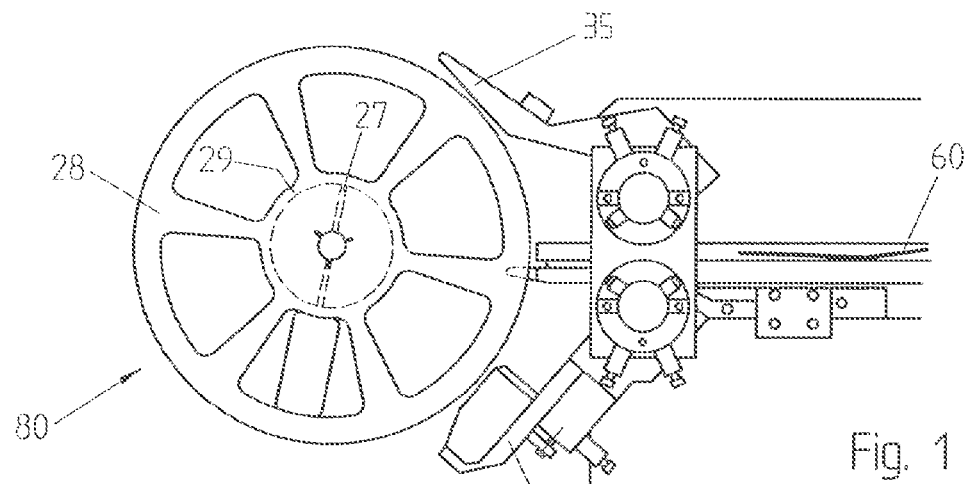
FIG. 1 shows a view of an automatic coiling device according to one aspect of the invention during a first phase of a coiling operation.

According to an aspect of the present invention, a device for the automatic coiling of flexible tape carrier includes, as shown in FIG. 1, a coiling station 80 to which a reel 28 can be connected. The reel 28 can be driven in rotation by a suitable rotation actuator, for coiling or uncoiling a carrier tape 60. The rotation actuator is preferably, but not necessarily, an electric motor driven by an industrial controller or processor, according to a defined program. The rotation actuator is not shown in the figures, for simplicity's sake. The reel 28 is connected to the coiling station automatically, or manually, according to the needs.

The tape carrier 60 is introduced from the right side of the device and is guided, as it will be explained in the following, to the hub 29 of the reel 28. The hub 29 presents, in this particular embodiment, a slot 27 that is provided for the insertion of the free end of the carrier tape 60. Other manners of connecting the free end of the tape to the wheel are however possible. The coiling device of FIG. 1 also comprises a pair of retractable guides 35, consisting in this case of a pair of articulated jaws. During reel changes and tape loading operations, the guides 35 assume an open configuration, as illustrated in FIG. 1, in which they are outside the rim of the reel, in order not to interfere with reel changes and tape loading.

Figure 2:
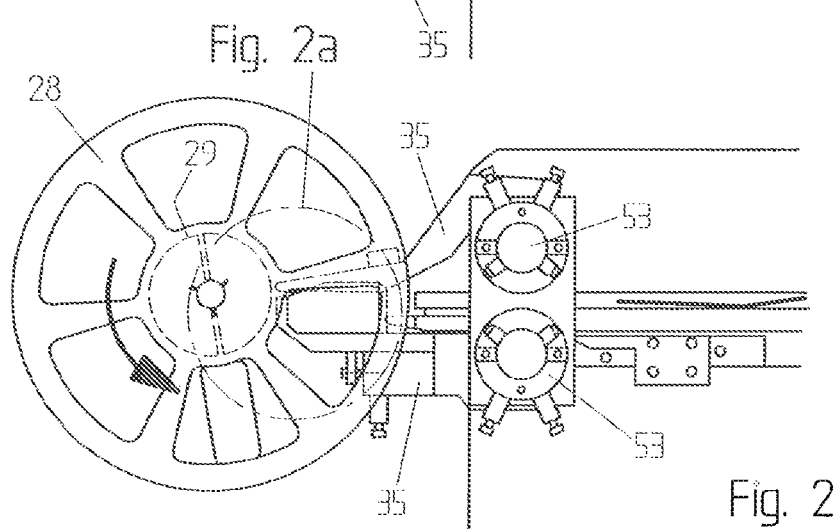
FIG. 2 shows the device of FIG. 1 prior of the engagement of a stopper element according to the invention.

During a loading operation, an empty reel is placed in the coiling location 80 and then the guides 35 are closed, as illustrated in FIGS. 2 and 2a, pivoting the guides 35 with the actuators 53, which can be pneumatic or electric, for example. In the closed configuration the tips of the guides are close to the surface of the hub 29. The guides 35, when closed together, have a free space between them that allows the guided introduction of the free end of the tape carrier 60 to the hub 29. Preferably the motion of the reel towards the coiling location 80 is driven or assisted by gravity.

FIG. 2a shows a detail of the loading machine and the lower guide 35, in which the upper guide is not illustrated, to simplify the drawing. The lower guide 35 carries, on its end closer to the reel, a pneumatic cylinder or another suitable linear actuator 89 that, when actuated, drives the stopper element 87 against a surface on the hub 29 of the reel.

Figure 3:
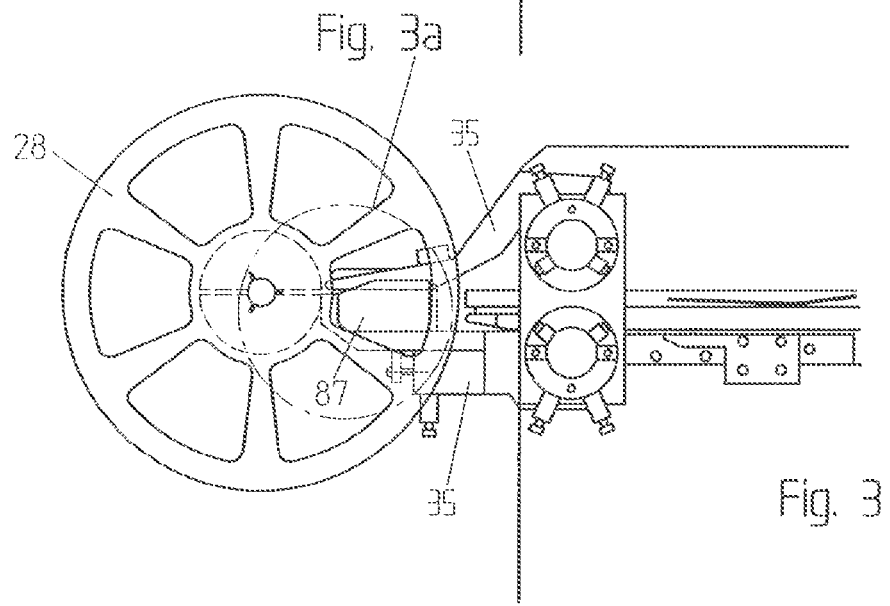
FIGS. 3 and 3a show the engagement of the stopper element in a slot in the hub of the reel.
Figure 3A:
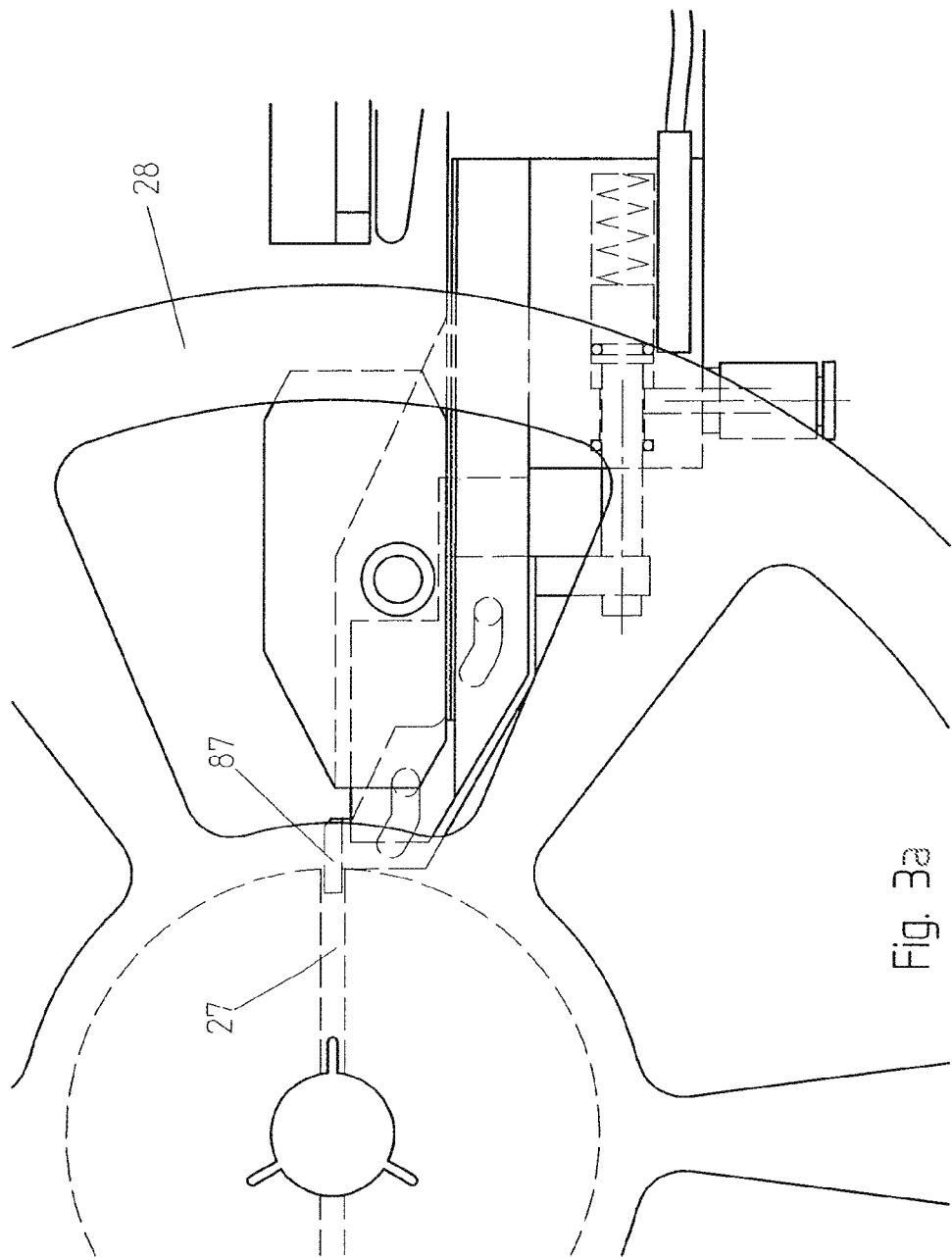

In this initial phase of the loading process, the reel is rotated, while the stopping element 87 is in sliding contact with the surface of the hub 29. When, in the course of the rotation, the slot 27 is aligned with the stopping element 87, the latter engages in the slot, as it is shown in FIGS. 3 and 3a. This produces the immediate arrest of the reel 28 that is stopped in a predetermined position in which the slot 27 is aligned with the stopping element 87 and the reel 28 is in a predefined angular relationship with the tape guides 35.

In an alternative embodiment of the invention, not illustrated, the stopping element 87 could engage with another part of the reel, for example the spokes, or a notch in the rim, in order to stop the reel 28 in a predefined angular relationship with the tape guide 35. Moreover the portion of the stopping element that engages into the slot of the hub or with another part of the reel is preferably interchangeable, so as to allow the loading of different kind of reels with the device and method of the invention.

The stopping of the rotation of the reel is sensed by a suitable stop detector of the loading device providing a stop detection signal when the rotation of the reel is stopped by the stopping element 87. In an embodiment, the rotation actuator of the reel is a DC electric motor or a stepper electric motor, and the stop detector is integrated in the motor itself or in the motor controller, for example the stop detector is an electric circuit responsive to the power or current absorbed, generating a stop signal when the rotation of the reel 28 is impeded by the stopping element 87. In other embodiments, the stop detector may be an optical or magnetic encoder sensitive to the rotation of the reel 28. In a further embodiment, the stop detector includes a switch, sensitive to the position of any part that moves integrally with the stopping element 87 and generating a stop signal when the stopping element 87 is engaged into the slot 27. Advantageously, the stop detector needs not be particularly accurate or fast, because the correct alignment of the slot 27 with the guides 35 is determined by the mechanical stopper 87.

In a variant of the invention, the mechanical stopper 87 is complemented by a second stopping device (not shown) that prevents the rotation of the reel 28 preferably engaging on the reel's side, for example, or alternatively braking the motor's axle. The second stopping device is preferably operated in response to the stop signal mentioned above. Its purpose is to limit the force between the mechanical stopper 87 and the slot 27, and to make sure the slot 27 is perfectly aligned with the guides. Auctioning the second stopping device may thus result in a fine correction of the angular position of the reel, which may slightly rotate in the clockwise or anticlockwise direction when the second stopping device is pushed against the reel. An additional, independent stop detector detects operation of this additional stooping device.

As shown in FIGS. 4 and 4a, in a further phase of the loading process, triggered by the stop signal generated by the additional stop detector, the reel is immobilized, and the stopper 87 is retracted with the actuator 89, clearing the slot 27, whereby the free end of the tape 60 can be inserted between the guides 35 into the slot 27. The motion of the stopper 87 is guided by the pins 93 sliding in the opening 91. In a first part of the motion, the stopper 27 moves in a radial direction relative to the reel 28 while, when the stopper has cleared the slot 27 and is farther from the hub, the motion is slanted downwards, in order to provide free passage of the tape carrier 60 into the slot 84. Advantageously, the top side of 84 of the stopper is aligned with the bottom side of the slot 27, when the stopper is in the fully retracted position, as shown in FIG. 4a, thus providing a guiding surface for the tape carrier.

In a further phase of the loading process, illustrated in FIG. 5, the free end of the tape 60 is firmly inserted in the slot, and the top guide 35 is lifted. The tape is continuously fed from the left and, further advance being impossible, an arc of slack tape (buffer arc) is formed. The height of the buffer arc may be sensed by a suitable optical or mechanical sensor, to compensate for speed variations, and to stop the winding process if the buffer becomes too high or to low, thus preventing excessive tension or excessive slack in the tape carrier. Alternatively, the length of the tape can be determined during the loading phase by the counter of the taping system.

Finally, as shown in FIG. 6, the lower guide is retracted, as well as the second stopping element, and the reel 28 is spun until the desired length of carrier tape is loaded.

According to aspect of the present invention, the inventive device is arranged to test whether the tape leader has been correctly inserted in the slot 27, and to take appropriate measures, like generating a warning signal and/or stopping the loading operation, in the case of a failed insertion.

The successful insertion of the tape leader into the slot 27 can be tested, for example, by rotating the reel 28, and at the same time prevent or limit the linear advance of the tape 60, for example pressing it on one of the guides 35 by a suitable actuator. It the tape 60 is correctly connected with the reel hub, rotation of the reel 28 will be hindered. On the other side, if the tape breaks or slips out of the slot 72 for whatever reason, the reel 28 will be able to rotate freely. The system senses the torque needed to rotate the reel 28 at a given angular speed, or the rotation speed obtained with a given driving torque, and compares them with reference values to decide whether the tape 60 is satisfactorily connected with the reel 28. This test needs only to be made once shortly after the insertion 8 or unsuccessful insertion) of the tape.

In another embodiment, the rotation speed of the reel is sensed with a suitable encoder; failure to insert the tape correctly will result in a higher speed, which can be detected for stopping the device.

According to a further aspect of the invention, the loading system is equipped with a sticker dispenser, that are automatically operated once the desired length of tape is loaded in the reel 28, to stick his free end to the coil of tape in the reel 28 automatically.

Figure 7:
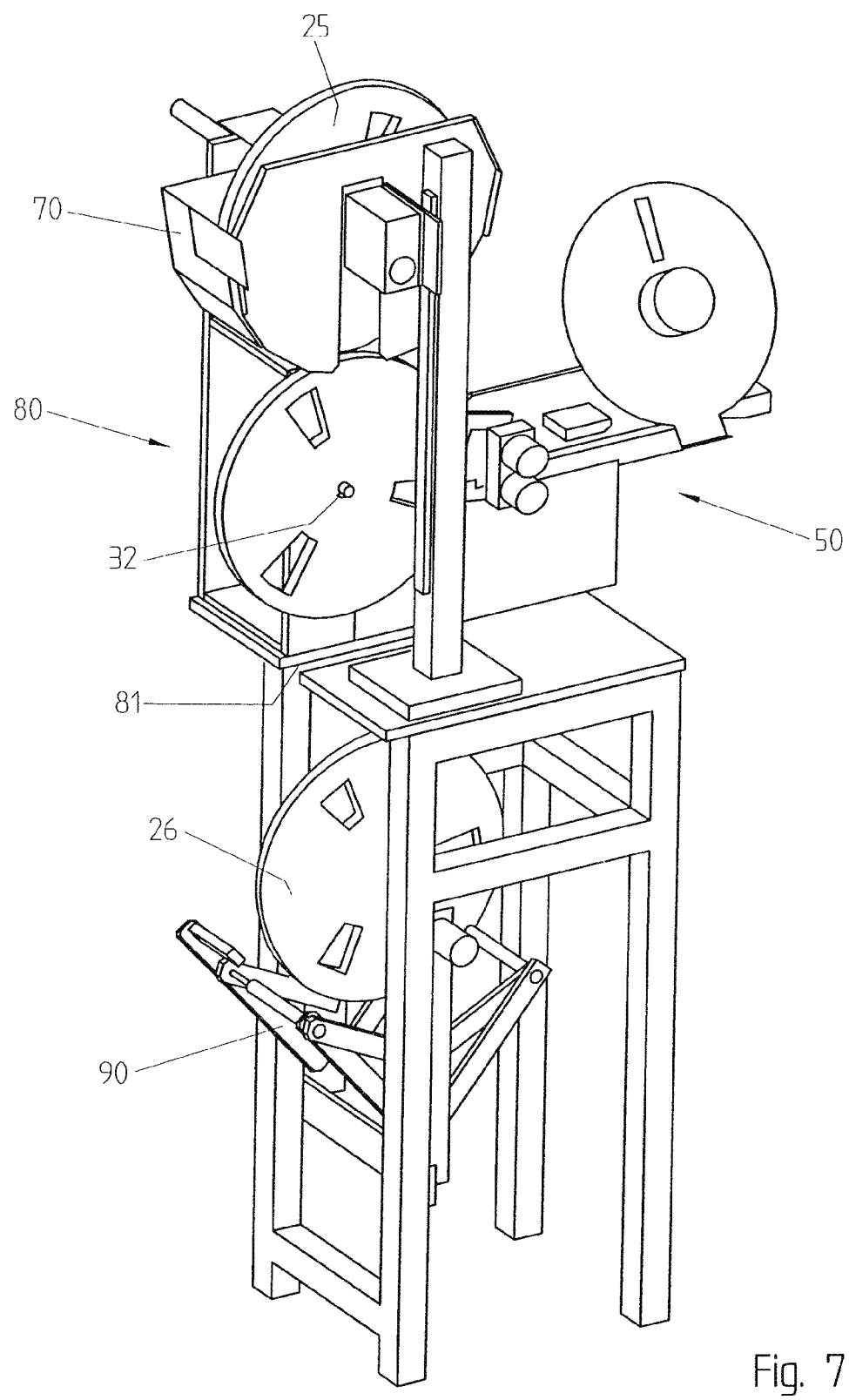
FIG. 7 shows a view of a coiling device according to one aspect of the present invention.

FIG. 7 represents an automatic reel-coiling and changing device according to one aspect of the invention. It includes an upper magazine 70 in which the empty reels 25 waiting to be processed are loaded. The upper magazine is placed above the coiling position 80 in which the reels are mounted on a rotatable shaft 32 for coiling. A tape insertion unit 50 is placed at the same level as the coiling position 80 and is used to automatically guide the tape leading section to the reel and affix it to the hub of the reel, as it will be explained later.

Figure 10:
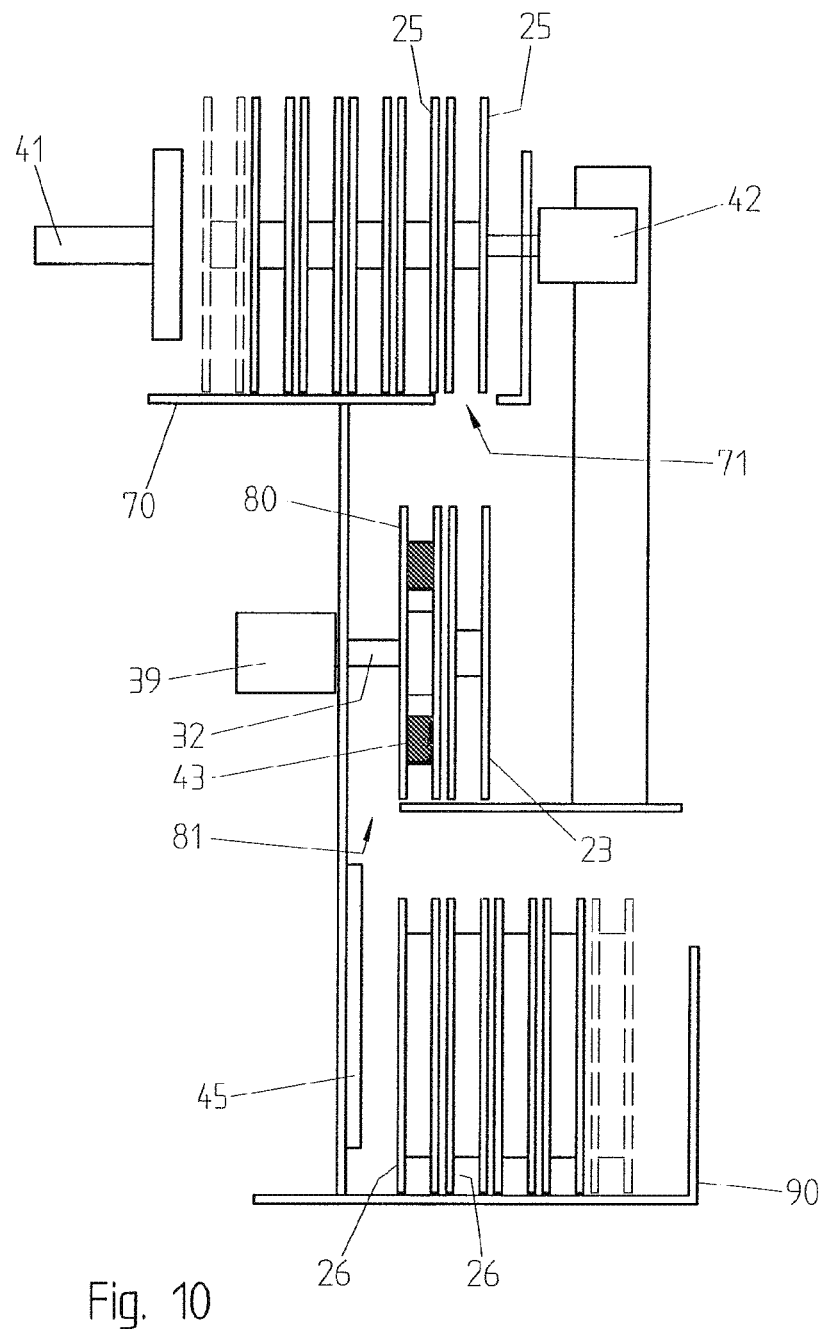
FIG. 10 shows, in a simplified schematic way, the automatic reel changing of the device of the invention.

FIG. 10 illustrates, in a simplified schematic way, the automatic reel changing system of the invention. The empty reels 25 in the upper magazine 70 are moved by the linear actuator 41 (for example an air cylinder, or a linear motor, or any other equivalent actuator) up to the axis reference The axis will be used as mechanical reference for the transfer of the roller from the upper magazine to the loading position.

Then a linear actuator (for example an air cylinder, or a linear motor, or any other equivalent actuator) will move the empty reel 25 through the opening 71 downwards until they are level with the shaft 32 at the coiling position 80. The movement can, in alternative, be guided by additional guiding elements like slides, roll or inclines (not represented) under the action of the gravity until it reaches the desired position.

At this point, the reel will be indexed by reference guides 43, which can be activated by cylinders, motors or any other suitable mechanic actuator. Once the reel 23 is in the reference position, the shaft 42 of the reeler will be inserted within the centre of the reel 23. The engagement can be obtained in several ways, for example by a second, non represented linear actuator or, preferably, by a sideways displacement of the shaft 42. After the shaft 32 is inserted and coupled with the reel 23 a motor 39, or any other suitable actuator, drives it in rotation in order to fill the reel with the desired amount of flexible tape carrier.

Upon completion of the coiling operation, the full reels 26 are disengaged from the shaft 32 and move downwards, under the action of gravity and of a linear actuator 45 (which could take the form, in different variants of the invention, of an air cylinder, linear motor or any equivalent actuator) into the lower magazine 90. The reels could also, in a variant of the invention fall down under the action of gravity only through openings 81. In this case the fall of the reels can be slowed down and guided by appropriate means, when necessary.

In a non-illustrated different variant of the invention, the reel in the coiling position 80 is not rotatably mounted on a shaft, but is moved to a centre-less rotatable support, including one or more free rollers, 5 and one or more driven rollers, interacting with the rim of the reel for supporting it and driving it in rotation (not represented here).

Figure 8:
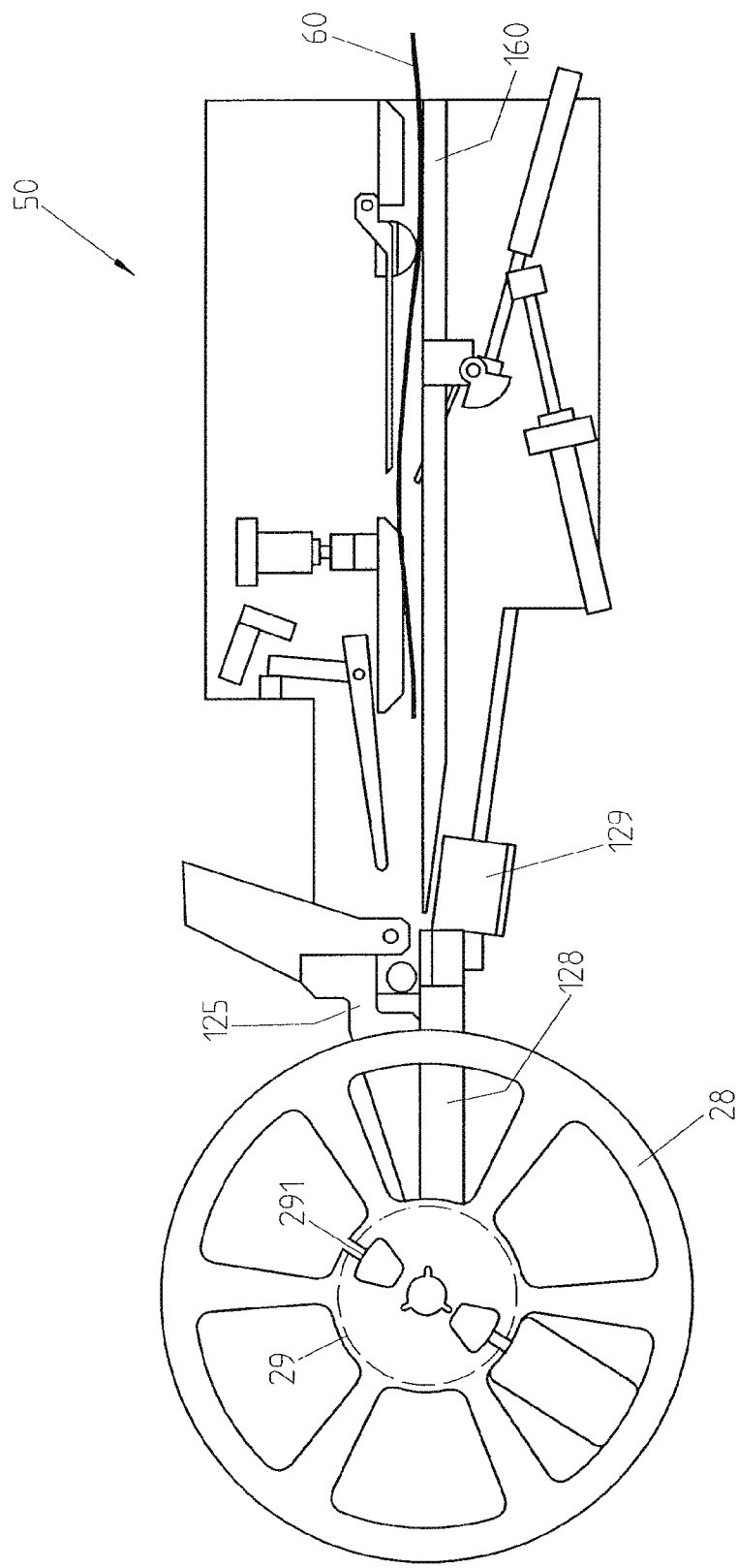
FIG. 8 shows more in detail the tape insertion unit of a device according to another embodiment of the invention.

The function of the tape insertion unit 50 is now explained with reference to another embodiment of the device, illustrated by FIGS. 8 to 10. A straight guide 160 guides the flexible tape 60 towards the hub 29 of the reel 28. The part of the guide closer to the hub is composed by a lower sliding guide 128, actuated by the air cylinder 129, and by an upper articulated jaw 125 that, when in operation, as shown in FIG. 8, are closed one against the other, defining a channel for guiding the tape to the hub 29 without any deviation. When the reel 28 must be inserted or removed, the articulated jaw rotates upwards, and the sliding guide 128 moves backwards, as shown in FIG. 9a, so as to clear the reel and allow its insertion or removal.

Figure 9A:
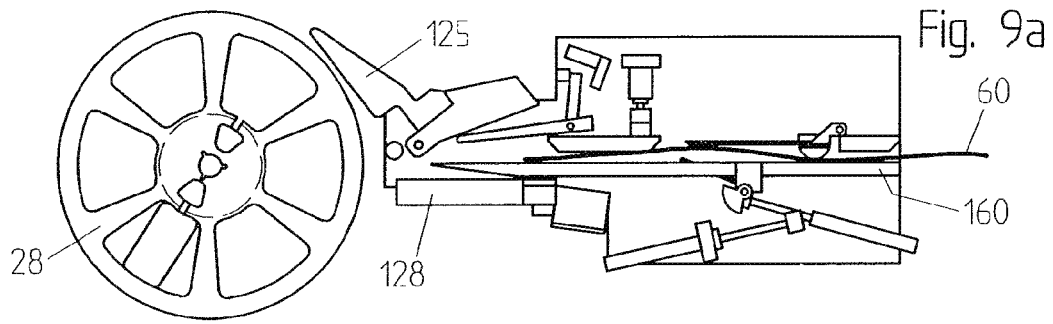
FIGS. 9a-9e illustrate a sequence of steps of the method in a device according to another embodiment of the invention.
Figure 9B:
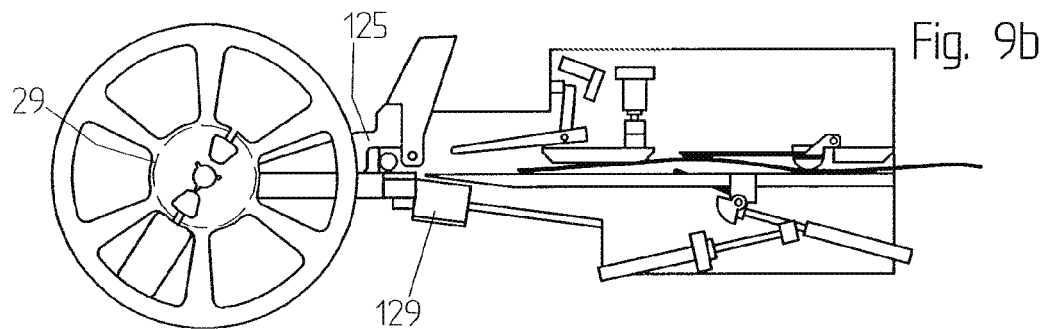
Figure 9C:
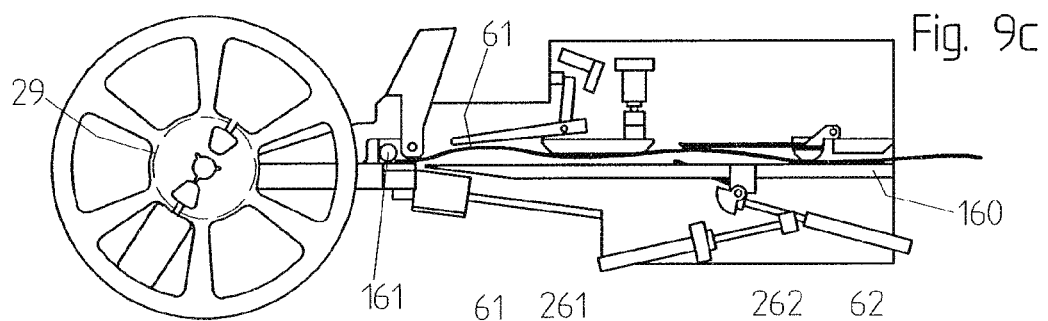

FIG. 9a illustrates the beginning of a coiling operation, in which the leading end 61 of the tape 60 is sliding along the guide 160 and is not yet close to the hub 29 of the wheel 28. In following steps, as shown in FIG. 9b, the jaw 125 and the sliding guide 128 are moved one against the other in order to provide a closed channel that guides the strip 60 to the hub 29 without bending it.

Once the leading edge of the strip 60 is sufficiently close to the hub 29, a vacuum is applied to a first restriction device 161 (FIG. 3c), in order to stop, or hinder, the forward motion of the flexible strip 60. Since the strip is continuously fed from behind, portion of the strip behind the restriction point 161 lifts from the straight guide 160 forming a slack arc 61, as visible in FIG. 9c.

Figure 9D:
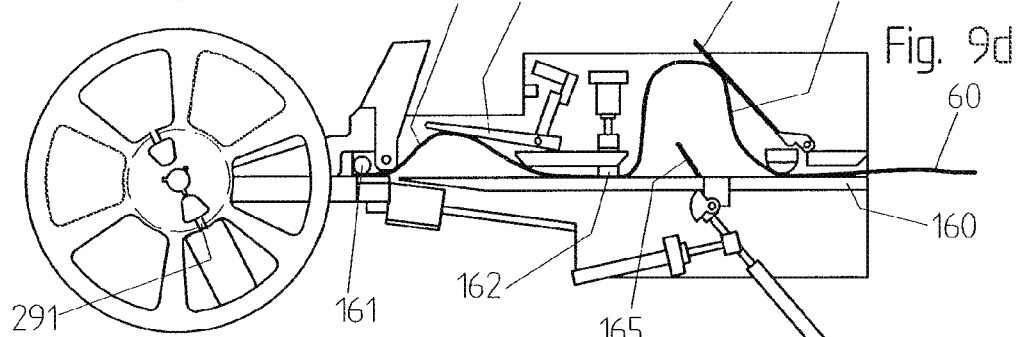

FIG. 9d illustrates a further stage of the reel change according to the method of the invention and shows that the arc 61 grows higher because the strip 60 is continuously fed from the right. The slack arc 61 is measured by the position sensor 261 that is arranged to detect when the arc 61 has reached a determined height. Once the desired height is attained for arc 61, a second restriction device 162, placed upwards with respect to the first restriction device and the feeding direction of the flexible tape 60, is activated to stop or hinder the tape motion, whereby a second arc 62 is formed in the tape 60 before the second restriction device 162.

The height of the second arc 62 is sensed by position sensor 262. In a variant, position sensors 261 and 262 are both mechanical switches. The invention however allows other type of position sensors, for example optical sensors, to sense the height of arcs 61 and 62. The structure of restriction devices 161 and 162 can also be adapted and changed, according to the circumstances. In a variant the first restriction device 161 is a vacuum suction plate, which has the advantage of not damaging or bending the leading end of the tape in any way. It is preferable, for an easy insertion in the slit 291 of the reel's hub 29, that the leading end should be kept very straight. The second restriction device 162 is located further upwards, in a position at which small bends in the tape are acceptable, and is a mechanical clamp, operated by a piston, that presses the tape onto the underlying guide 160.

The insertion unit of the invention preferably includes also a moveable obstacle 165 that is lifted above the straight guide 160 in order to assist the formation of the arc 62. In a simplified variant, the obstacle 165 could also be fixed.

Figure 9E:
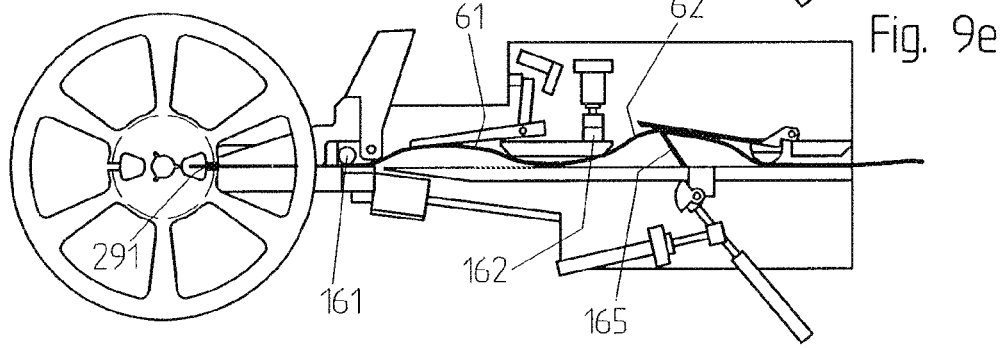

FIG. 9e illustrates some last steps of the insertion process. The restriction device 161 and then the restriction device 162 are deactivated, whereby the slack tape in the loops is released and the leading edge of the tape moves rapidly forward, and enters the slit 291 of the reel's hub 29. Preferably the angular position of the reel 29 is measured by a suitable sensor, and the deactivation of the restriction devices 161 and 162 is timed relative to the passage of the slit 291 in alignment with the leading edge of the tape. Though slotted hubs are almost universally used, it is conceivable that the invention could be used with different kinds of 5 fixation features, for example a hook, a roller, a magnetic connection, or any suitable fixation.

Once the leading edge is inserted in the slit 291, the coiling of the tape 60 in the reel 29 can proceed normally. Preferably, the jaw 125 and the lower guide 128 are retreated ad this moment, to leave space for the tape inside the reel. The speed of rotation of the reel 29 and/or the feeding speed of the tape 60 are preferably controlled so as to maintain a set height in the arcs 61 and 62, as sensed by detectors 261 and 262. In this manner the tape tension is minimal, even at high coiling speed, and is reduced the friction of the tape on the guide.

Another independent aspect of the invention concerns a device for the automatic coiling and/or uncoiling of a flexible tape 60 on reels 28 comprising: a coiling location 80 where a reel 28 can be rotatably connected to the device; a tape insertion unit 50, operatively arranged to guide the flexible tape 60 and connect a free end of the flexible 60 tape to a hub of the reel 28. Preferably the devices includes also: a first reel magazine 70 for stocking reels to be processed 25 and placed above the coiling location 80, a second reel magazine 90 for stocking the reels that have been processed 26 placed below the coiling location 80, the device being operatively arranged to move the reels to be processed 25 from the first magazine 70 towards the coiling location 80, coil the flexible tape 60 in the reels, and to move the processed reels 26 from the coiling location 80 to the second magazine 90, the motion of the reels from said first magazine 70 and/or to said second magazine 90 being driven or assisted by gravity.

According to a variant, the above described device further comprising a linear actuator 41, operatively arranged to connect the reels to be processed to the device in the coiling location 80, and/or a linear actuator 41 operatively arranged to move the reels to be processed 25 above a opening 71 in said first reel magazine 70, whereby the reels to be processed 25 move to the opening 71 in their motion towards the coiling 5 location 80.

Preferably the reels that ought to be loaded in the device of the invention are mounted on a rotatable shaft 32 provided to this purpose. In variants, however, the reel could be driven by a roller interoperating with an outer rim of the reel to drive the reel in rotation. Centre-less arrangements, in which one or more free rollers to rotatably support the reel in the coiling location are also possible.

In another variant the tape insertion unit of the loading device of the invention contains one linear guide 160 and at least one, preferably two restriction means 161, 162 that can be operated to stop or hinder the advance of at least a section of the flexible tape 60 and induce the formation of one or two arcs 61, 62 behind the restriction means 161, 162, the arc being a self-supported slack portion of the tape 60 lifted from the linear guide 160. Said restriction means may consist in a mechanical clamp 162 or a vacuum suction device 161, for example, and position detectors 261, 262 may be arranged to detect the height of at least one arc 61, 62 in the flexible tape 60.

The present invention therefore provides also a method for coiling a flexible tape carrier 60 on a reel 28, said tape 60 comprising a leading end for engagement in the reel 28, the method comprising the steps of: feeding the flexible tape 60 towards the reel 28; stopping or hindering the advance of said leading end with a first restriction means 161 so as to produce a first slack arc portion 61 in the flexible tape 60; detecting when the first slack arc portion has reached a determined height; stopping or hindering the advance of one intermediary portion of tape with a second restriction means 62 while feeding the flexible tape further, so a to produce a second slack arc portion 62 of tape; detecting engagement of said leading end into a hub 29 of the reel 28 or alignment of said leading end with a fixation feature 291 of the hub 29 of the reel; releasing the restriction means 161, 162.

The invention claimed is:

1. A device for the automatic coiling and/or uncoiling on reels (28) of a flexible tape carrier (60) of electronic components, the device comprising:
a coiling location (80) where a reel (28) can be connected to a rotation actuator;
tape guides (35), operatively arranged to guide the flexible tape (60) and to connect a free end of the flexible tape (60) to a hub (29) of the reel (28);
a stopper element (87), drivable by an actuator (89) in an engagement position in which the stopper elements engages with said reel and stops the rotation of the reel (28), leaving the reel (28) in a predefined relationship with the tape guides, wherein the stopper element (87) engages with a slot (27) in the hub (29) of the reel (28);
a stop detector, arranged to generate a stop detection signal upon engagement of said stopper element with said reel.

2. The device according to claim 1, wherein the stopper element (87) is further drivable in a rest position in which it is disengaged from the reel (28), the stopper element in the rest position allowing the insertion of said free end of said flexible tape (60) into said slot.

3. The device according to claim 1, wherein said stop detector is an optical or magnetic or resistive detector arranged for detecting displacement of said stopper element (87).

4. The device according to claim 1, wherein said stop detector includes a switch sensitive to the position of said stopper element (87).

5. The device according to claim 1 in which the tape guides (35) are retractable.

6. The device according to claim 1, wherein the tape guides (35) consist in two articulated jaws that can assume an open position, allowing the insertion of the reel (28) in the coiling location and the loading of the tape carrier, in which the articulated jaws are outside a rim of the reel (28), and a closed position, assisting the connection of the free end of the flexible tape (60) to the hub (29) of the wheel (28), in which the tape guides enter into the reel (28).

7. The device according to claim 6, wherein the stopper element (87) is connected to a free end of one of said articulated jaws.

8. The device according to claim 1, wherein the stopper element (87) has an interchangeable engaging portion.

9. The device according to claim 1, comprising a second stopper element arranged for acting on the side of the reel, said stopper element being actuated by said stop detection signal.

10. The device of claim 9, said second stopper element being arranged for modifying the angular position of the reel so as to align the reel with the tape when the reel is stopped by the second stopper element.

11. The device according to claim 1, wherein said rotation actuator comprises an electric motor urging in rotation said reel (28), and comprising a rotation detector integrated in said electric motor.

12. The device according to claim 1, wherein motion of the reels (28) to and from said coiling location (80) is gravity driven.

13. The device according to claim 1, wherein the motion of the stopper element (87) between the engagement position and the rest position is guided as to move the stopper element (87) along a radial direction relative to the reel (28), in a first portion of motion, and in a slanted direction, in a second portion of motion farther from the hub of the reel than the first portion.

14. The device according to claim 1, further comprising a sticker dispenser for stick a free end of the tape in the reel automatically.

15. The device according to claim 1, comprising:
- a connector to connect a reel to the coiling location;
- a rotation actuator to rotate the reel;
- a stopper actuator to drive the stopper element into engagement with a slot in the hub of the reel;
- a detector to detect the engagement of the stopping element by the stop detector;
- an immobilizer to immobilize the rotation actuator;
- wherein the stopper actuator is further configurable to drive the stopper element into a rest position;
- a tape loader configurable to insert the free end of the flexible tape into said slot;
- wherein the rotation actuator is further configurable to rotate the reel to load the reel with flexible tape.

16. A method of loading a flexible tape carrier (60) for semiconductor components in a reel (28), comprising the steps of:
- connect an empty reel (28) to a rotation actuator;
- rotate the reel (28) with the rotation actuator;
- drive a stopper element (87) into engagement with a slot (27) in the hub (29) of the reel, thereby stopping the rotation of the reel (28);
- detect the engagement of the stopper element (87) by a stop detector;
- immobilize the rotation actuator;
- drive the stopper element (87) in a rest position leaving a free passage for a free end of said flexible tape carrier (60) to said slot (27);
- insert the free end of the flexible tape (60) into said slot (27);
- rotate the reel to load it with flexible tape (60).

17. The method of claim 16, further comprising detecting failed insertion of the tape (60) in the slot (27), and stopping the advance of said tape (60) in case of failed insertion.

18. The method of claim 17, wherein failed insertion is detected by determining the torque or speed or current applied to or by said rotation actuator.

19. A device for the automatic coiling and/or uncoiling on reels (28) of a flexible tape carrier (60) of electronic components, the device comprising:
- a coiling location (80) where a reel (28) can be connected to a rotation actuator;
- tape guides (35), operatively arranged to guide the flexible tape (60) and to connect a free end of the flexible tape (60) to a hub (29) of the reel (28);
- a stopper element (87), drivable by an actuator (89) in an engagement position in which the stopper elements engages with said reel and stops the rotation of the reel (28), leaving the reel (28) in a predefined relationship with the tape guides;
- a stop detector, arranged to generate a stop detection signal upon engagement of said stopper element with said reel
- wherein the motion of the stopper element (87) between the engagement position and the rest position is guided as to move the stopper element (87) along a radial direction relative to the reel (28), in a first portion of motion, and in a slanted direction, in a second portion of motion farther from the hub of the reel than the first portion.

* * * * *

UNITED STATES PATENT AND TRADEMARK OFFICE
CERTIFICATE OF CORRECTION

PATENT NO. : 8,439,292 B2  
APPLICATION NO. : 13/099470  
DATED : May 14, 2013  
INVENTOR(S) : Toh Hau Goh et al.

Page 1 of 1

It is certified that error appears in the above-identified patent and that said Letters Patent is hereby corrected as shown below:

In the specification, column 5, line 41, please add -- 41 -- after "actuator"

Signed and Sealed this  
Twenty-fourth Day of September, 2013

Teresa Stanek Rea  
*Deputy Director of the United States Patent and Trademark Office*